United States Patent
Chen (10) Patent No.: US 10,964,014 B2
(45) Date of Patent: Mar. 30, 2021

(54) DEFECT DETECTING METHOD AND DEFECT DETECTING SYSTEM

(71) Applicant: Taiwan Semiconductor Manufacturing Co., Ltd., Hsinchu (TW)

(72) Inventor: Chien-Huei Chen, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 528 days.

(21) Appl. No.: 15/884,305

(22) Filed: Jan. 30, 2018

(65) Prior Publication Data

US 2019/0130551 A1    May 2, 2019

Related U.S. Application Data (60) Provisional application No. 62/579,106, filed on Oct. 30, 2017.

(51) Int. Cl.
*G06T 7/00* (2017.01)
*G01N 21/88* (2006.01)
(Continued)

(52) U.S. Cl.
CPC ......... *G06T 7/001* (2013.01); *G01N 21/8851* (2013.01); *G01N 21/956* (2013.01);
(Continued)

(58) Field of Classification Search
None
See application file for complete search history.

(56) References Cited

U.S. PATENT DOCUMENTS

| 6,122,397 A * | 9/2000 | Lee ..................... G06T 7/001 382/141 |
| 2004/0179726 A1 | 9/2004 | Burdorf et al. |

(Continued)

FOREIGN PATENT DOCUMENTS

| CN | 1501174 | 6/2004 |
| CN | 101241084 | 8/2008 |

(Continued)

OTHER PUBLICATIONS

"Office Action of Taiwan Counterpart Application", dated Nov. 15, 2018, p. 1-p. 3.

(Continued)

*Primary Examiner* — David Perlman
(74) *Attorney, Agent, or Firm* — JCIPRNET (57) ABSTRACT

A defect detecting method, a defect detecting system, and a non-transitory computer-readable medium are provided. The defect detecting method includes applying a rank filter to multiple scan images of consecutive dies of a reference wafer scanned by a wafer inspection tool to obtain multiple reference die images; collecting multiple target die images of a target die of a target wafer scanned by the wafer inspection tool; comparing the target die images with the reference die images to detect multiple defects according to differences of pixel values of corresponding pixels in the target die images and the reference die images; and excluding multiple common defects from the detected defects to detect at least one mask defect printed on the target wafer, where the common defects are obtained by the wafer inspection tool performing a wafer inspection on the target wafer.

20 Claims, 5 Drawing Sheets

(51) Int. Cl.
*G03F 7/20* (2006.01)
*G01N 21/956* (2006.01)

(52) U.S. Cl.
CPC ... *G03F 7/7065* (2013.01); *G01N 2021/8887* (2013.01); *G01N 2021/95676* (2013.01); *G06T 2207/30148* (2013.01)

(56) References Cited

U.S. PATENT DOCUMENTS

| | | | |
|---|---|---|---|
| 2008/0295048 A1* | 11/2008 | Nehmadi et al. | G01R 31/318511 716/136 |
| 2009/0041332 A1* | 2/2009 | Bhaskar | G01N 21/93 382/145 |
| 2009/0268984 A1* | 10/2009 | Intwala | G06T 7/32 382/294 |
| 2016/0061745 A1* | 3/2016 | Chen | G01N 21/9501 356/237.5 |

FOREIGN PATENT DOCUMENTS

| | | |
|---|---|---|
| CN | 106662538 | 5/2017 |
| JP | 2016009180 | 1/2016 |
| TW | 201614586 | 4/2016 |
| TW | 201708942 | 3/2017 |

OTHER PUBLICATIONS

"Office Action of China Counterpart Application," dated Apr. 1, 2020, p. 1-p. 12.

* cited by examiner

DEFECT DETECTING METHOD AND DEFECT DETECTING SYSTEM

CROSS REFERENCE TO RELATED APPLICATION

This application claims the priority benefit of U.S. provisional application Ser. No. 62/579,106, filed on Oct. 30, 2017. The entirety of the above-mentioned patent application is hereby incorporated by reference herein and made a part of specification.

BACKGROUND OF THE INVENTION

1. Field of the Invention

The disclosure relates to a method and a system for detecting defects.

2. Description of Related Art

Photolithography is one of major process of semiconductor fabrication. In the photolithography process, light is used to transfer a geometric pattern from a photomask to a light sensitive photoresist on a substrate or a wafer. Every die on the wafer is usually printed by a same photomask. Consequently, wafer defects resulting from photomask defects repeat on every die thus being undetectable by the existing wafer inspection tools such as tools of KLA or UVision which are based on die-to-die comparisons. As such, existence of defects on the photomask may cause significant yield loss before the photomask defects are detected by mask inspection and repaired.

Mask inspection is typically performed once in a week to remedy the defects on the photomask. However, mask inspection is an expensive and intrusive operation that puts off the process, and therefore it is waste to be performed frequently. To minimize yield loss and to reduce cost, it is desirable to detect defects on the photomask as early as possible without the mask inspection.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
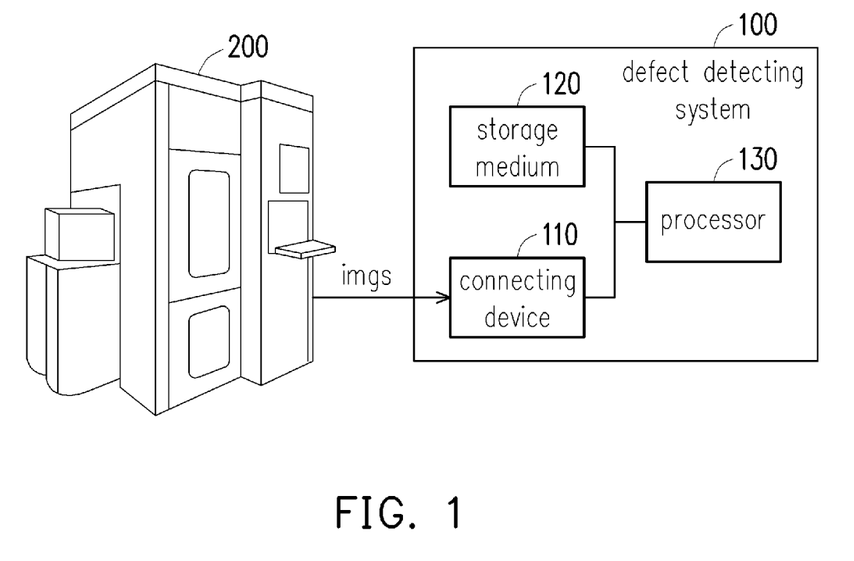
FIG. 1 illustrates a schematic block diagram of a defect detecting system according to an embodiment of the disclosure.

FIG. 1 illustrates a schematic block diagram of a defect detecting system according to an embodiment of the disclosure. Referring to FIG. 1, a defect detecting system 100 includes a connecting device 110, a storage medium 120, and a processor 130 coupled to the connecting device 110 and the storage medium 120.

In some embodiments, the defect detecting system 100 is externally connected to a wafer inspection tool 200 by a wired or wireless manner, where the wafer inspection tool 200 is configured to scan images of printed wafer for real-time detecting defects on the printed wafer (e.g., by die-to-die comparison). On the other hand, the defect detecting system 100 is configured to acquire the scan images imgs from the wafer inspection tool 200 and perform massive calculations on the acquired scan images imgs, so as to figure out defects existing on the photomask (also referred to as mask hereinafter) by the defect detecting method introduced in the disclosure without performing mask inspections on the mask.

It is noted that the defect detecting system 100 may be disposed or embedded in the wafer inspection tool 200 in other embodiments, which is not limited herein. The defect detecting system 100 and the wafer inspection tool 200 will be described in detail in the following descriptions.

The connecting device 100 is configured to connect to the wafer inspection tool 200 to receive scan images imgs scanned by the wafer inspection tool 200. The connecting device is, for example, any wired or wireless interface compatible to the wafer inspection tool 200 such as USB, firewire, thunderbolt, universal asynchronous receiver/transmitter (UART), serial peripheral interface bus (SPI), WiFi, or Bluetooth, which is not limited herein.

The storage medium 120 is configured to store scan images received by the connecting device 110. It is noted that the scan images from the wafer inspection tool takes a considerable amount of memory storage, hence the storage medium 120 is, for example, a mass storage device, a redundant array of independent disks (RAID), other similar storage device or a combination thereof having a high storage capacity. It is noted that the disclosure in not limited thereto.

The processor 130 is configured to execute instructions for carrying out the defect detecting method of the embodiments of the disclosure. The processor 130 is, for example, a central processing unit (CPU), other programmable general-purpose or specific-purpose microprocessors, a digital signal processor (DSP), a programmable controller, an application specific integrated circuit (ASIC), a programmable logic device (PLD), other similar devices, or a combination thereof, for example. It should be noted that the disclosure is not limited thereto.

Figure 2:
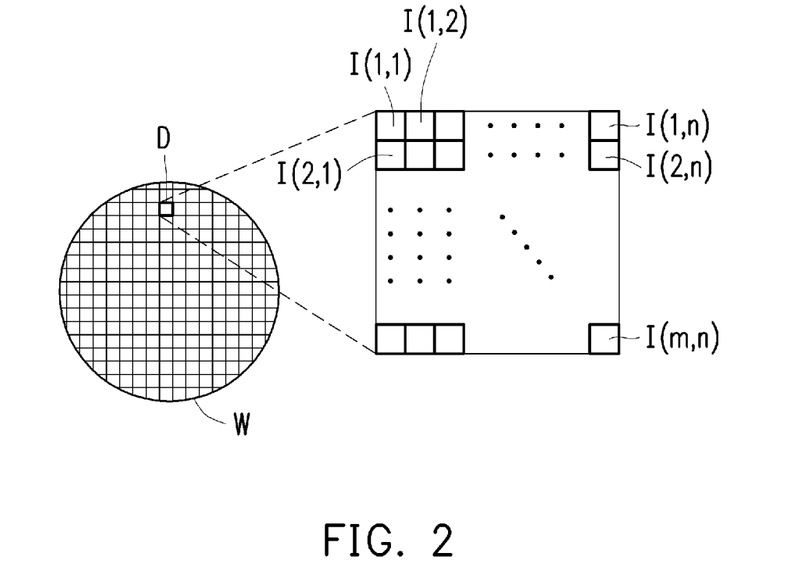
FIG. 2 illustrates a schematic diagram of scan images scanned by a wafer inspection tool according to an embodiment of the disclosure.

FIG. 2 illustrates a schematic diagram of scan images scanned by a wafer inspection tool according to an embodiment of the disclosure. Referring to FIG. 2, when scanning the wafer W, the wafer inspection tool 200 obtains multiple scan images per die. In the embodiment, the wafer inspection tool 200 obtains m*n scan images I(1, 1) to I(m, n) from the die D as shown in FIG. 2, where m and n are both natural number greater than 1. The two-dimensional parameter marked in the back indicates the location (or say, the coordinate) on the die D at which the image is captured. Specifically, the two-dimensional parameter (1, 1) of the scan image I(1, 1) indicates that the scan image I(1, 1) is an image captured at the top left corner of the die D, the two-dimensional parameter (m, n) of the scan image I(m, n) indicates that the scan image I(m, n) is an image captured at the lower right corner of the die D, and so on. Accordingly, two images of two different dies having the same parameter indicate that the two images are captured at the same location of each dies.

Besides, the number of the pixels in each scan image depends on the resolution of the wafer inspection tool 200, which is not limited herein. On the other hand, the number of images obtained from one single die is not limited in the disclosure either. In the following descriptions, the location at which the image being captured is indicated by the two-dimensional parameter in the similar way of the embodiment of FIG. 2.

In some embodiments of the disclosure, two main stages are included in the defect detecting method. The first stage is to construct reference die images, and the second stage is to detect defects in run time using scan images scanned by the wafer inspection tool 200 and the reference die images constructed in the first stage.

Construction of Reference Die Images

Figure 3:
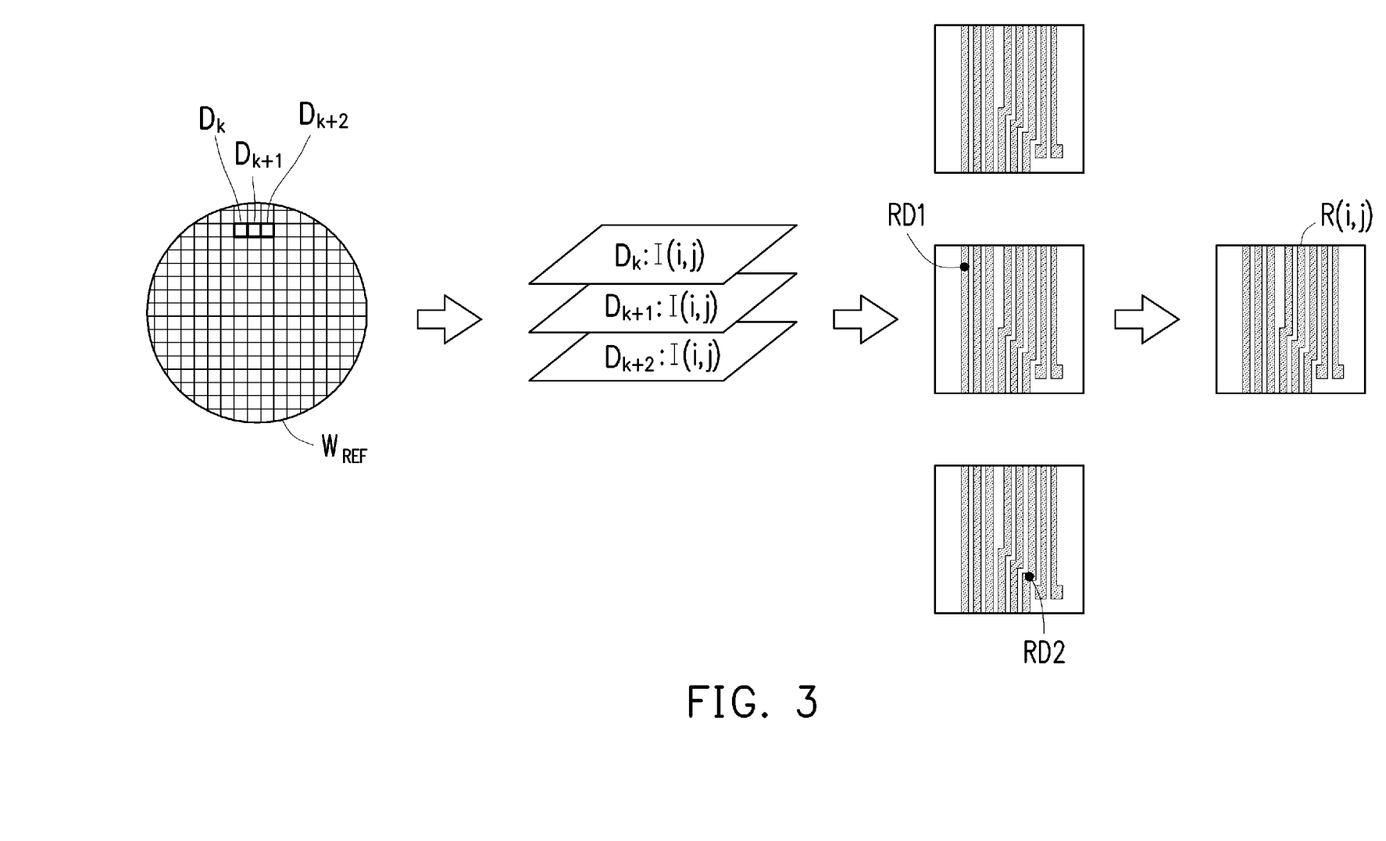
FIG. 3 illustrates a schematic diagram of constructing reference die images according to an embodiment of the disclosure.

FIG. 3 illustrates a schematic diagram of constructing reference die images according to an embodiment of the disclosure. Referring to FIG. 3, reference die images are constructed by using a reference wafer $W_{REF}$ in the first stage, such that the constructed reference die images can be used as a standard for detecting the defects on a printed wafer in the second stage.

In some embodiments, the reference die images are die images that include no defects (also referred to as defect-free die images). Therefore, a mask-defect-free wafer which is printed right after all mask defects are repaired by performing mask inspection is taken as the reference wafer $W_{REF}$. However, the disclosure is not limited thereto. One skilled in the art can select any wafer (e.g., a wafer printed by a brand new mask) as the reference wafer $W_{REF}$ according to their needs.

It should be noted that the reference wafer $W_{REF}$ does not amount to a perfect wafer, and random defects may still occur on one or more dies of the reference wafer $W_{REF}$. However, the random defects usually do not repeat at the same location of two dies of the reference wafer $W_{REF}$, therefore the random defects shown in the scan images of the reference wafer $W_{REF}$ can be cleaned up by applying rank filter to corresponding scan images of multiple dies.

Directed to the reference wafer $W_{REF}$ which has been selected, the processor 130 obtains scan images of multiple consecutive dies (e.g., at least three consecutive dies) of the $W_{REF}$, such that the reference die images can be calculated by applying rank filter to the obtained scan images. In some embodiments, the wafer inspection tool 200 obtains the scan images of the whole wafer $W_{REF}$ and the processor 130 receives the scan images from the wafer inspection tool 200 through the connecting device 110 and stores the same into the storage medium 120. However, the disclosure is not limited thereto. In other embodiments, the wafer inspection tool 200 may only scan the consecutive dies indicated by a signal input to the wafer inspection tool 200 to obtain the scan images of the indicated consecutive dies, and the processor 130 receives the scan images from the wafer inspection tool 200 and stores the same into the storage medium 120.

Referring to FIG. 3, in this embodiment, the processor 130 obtains multiple scan images (e.g., m*n images as shown in FIG. 2) of each die $D_k$, $D_{k+1}$ and $D_{k+2}$ scanned by the wafer inspection tool 200 using a highest resolution thereof. The scan images of the consecutive dies $D_k$, $D_{k+1}$ and $D_{k+2}$ are stacked into a three-dimensional (3D) array of pixels. As shown in FIG. 3, pixels of the scan image I(i, j) of $D_k$ are arranged in the first stack, pixels of the scan image I(i, j) of $D_{k+1}$ are arranged in the second stack, and pixels of the scan image I(i, j) of $D_{k+2}$ are arranged in the third stack. In this embodiment, the scan image I(i, j) with the two-dimensional parameter (i, j) is used for describing how the scan images are being stacked, and all other scan images of the consecutive dies $D_k$, $D_{k+1}$ and $D_{k+2}$ are stacked by the similar way. Accordingly, the 3D array of pixels of the scan images of the consecutive dies $D_k$, $D_{k+1}$ and $D_{k+2}$ is obtained.

In some embodiments, the processor 130 obtains the scan images of more than three consecutive dies, and stacks the scan images of each die to form a 3D array of pixels of the scan images of the consecutive dies. The number of said consecutive dies is not limited in the disclosure.

Afterwards, a rank filter is applied to the corresponding pixels of each stack. In some embodiments, the rank filter is a median filter. Referring to FIG. 3, no random defect is rendered in the scan image I(i, j) of the die $D_k$, a random defect RD1 is rendered in at least one pixel of the scan image I(i, j) of the die $D_{k+1}$, and a random defect RD2 is rendered in at least one pixel of the scan image I(i, j) of the die $D_{k+2}$. By applying the median rank filter to the corresponding pixels of each stack, the reference die image R(i, j) is formed. Specifically, the median rank filter takes the median of the three pixel values of the corresponding three pixels in the scan images I(i, j) of the dies $D_k$, $D_{k+1}$, and $D_{k+2}$. It turns out that the pixels in the scan image I(i, j) of the die $D_{k+1}$ rendering the random defect RD1 and the pixels in the scan image I(i, j) of the die $D_{k+2}$ rendering the random defect RD2 are discarded after applying the median rank filter to the corresponding pixels of the scan images I(i, j) of the dies $D_k$, $D_{k+1}$, and $D_{k+2}$, so that a clean reference die image R(i, j) is thus formed. In this embodiment, the other reference die images corresponding to the same die of the reference wafer $W_{REF}$ are formed by the same way as the reference die image R(i, j) described in the foregoing descriptions. For example, the reference die image R(i+1, j+1) can be formed by applying rank filter on the corresponding pixels of the scan images I(i+1, j+1) of the dies $D_k$, $D_{k+1}$, and $D_{k+2}$, the reference die image R(i+2, j+2) can be formed by applying rank filter on the corresponding pixels of the scan images I(i+2, j+2) of the dies $D_k$, $D_{k+1}$, and $D_{k+2}$, and so on.

However, the disclosure does not limit the rank filter which is selected to be used. One skilled in the art can choose other rank filters for eliminating the random defects and obtaining the reference images as their needs.

According to the foregoing descriptions, a set of the reference die images (e.g., m*n reference die images according to FIG. 2) corresponding to a die of the reference wafer $W_{REF}$ including the reference die image R(i, j) are obtained. In some embodiments, the obtained reference die images are stored into the storage medium 120.

In some embodiments, the consecutive dies may be scanned by the wafer inspection tool 200 multiple times each with slight sub-pixel offset, so as to obtain multiple sets of the reference die images by the processor 130 of the defect detecting system 100, and each set of the reference die images corresponds to one die of the reference wafer $W_{REF}$ or to the scan images scanned at one time.

Run-Time Defect Detection

During run time for printing wafers, the wafer inspection tool 200 is online and scans the printed wafers to obtain multiple die images of each die of each printed wafer, and performs wafer inspection (e.g., in a die-to-die comparison manner) thereon to detect defects on the printed wafers. It is noted that if a defect is a mask defect (i.e., a defect resulting from one or more defects of the mask), the defect would repeat on every dies of the printed wafers and thus being undetectable by the wafer inspection performed by the wafer inspection tool 200.

In some embodiments of the disclosure, the processor 130 of the defect detecting system 100 collects multiple scan images (also referred to as target images hereinafter) of one of multiple dies (also referred to as a target die hereinafter) of one of at least one printed wafer (also referred to as a target wafer hereinafter) from the wafer inspection tool 200. Ideally, differences between the target die images and the reference die images obtained in the first stage are supposed to be corresponding to all defects on the target die of the target wafer no matter where the defect comes from. Therefore, the processor 130 compares the target die images and the reference die images to detect the defects according to differences of pixel values of corresponding pixels of the target die images and the reference die images.

In this embodiment, the target die and the dies for constructing the reference die images are scanned under the same imaging condition, such that the target die images and the reference die images can be compared on a same comparison basis. However, the disclosure is not limited herein.

In some embodiments, the defect detecting system 100 further performs image processing (i.e., pre-processing) such as a histogram equalization and an image alignment on the target die images, in order that the target die images and the reference die images can be compared on the same comparison basis.

Figure 4:
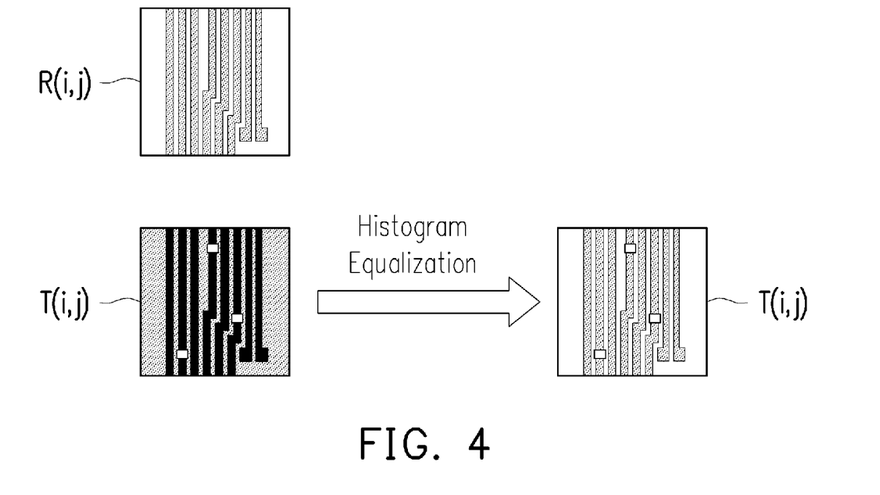
FIG. 4 illustrates a schematic diagram of histogram equalization according to an embodiment of the disclosure.

FIG. 4 illustrates a schematic diagram of histogram equalization according to an embodiment of the disclosure. Due to different capturing time, different capturing environment, different machine status, or other possible reasons, the target die images and the reference die images may have different contrast. However, such contrast difference makes the comparison between the target die images and the reference die images difficult.

In some embodiments, histogram equalization is performed on the target die images to match a histogram of the target images with a histogram of the reference die images. Specifically, the contrast or grey scale range of pixel values of a target die image is adjusted to have a similar contrast or grey scale range of pixel values with a certain reference die image, where the adjusted target die image is captured at the same location on a die with the certain reference die image. Referring to FIG. 4, the target die image T(i, j) is adjusted by the processor 130 to have a similar contrast with the reference die image R(i, j) which is captured at the same location on a die with the target die image T(i, j). Similarly, the target die image T(i+1, j+1) is adjusted by the processor 130 to have a similar contrast with the reference die image R(i+1, j+1) which is captured at the same location on a die with the target die image T(i+1, j+1), the target die image T(i+2, j+2) is adjusted by the processor 130 to have a similar contrast with the reference die image R(i+2, j+2) which is captured at the same location on a die with the target die image T(i+2, j+2), and so on. One skilled in the art should have basic knowledge about the histogram equalization, or could obtain relevant information about the histogram equalization from related documents of image processing, therefore details of the histogram equalization are not described herein.

It should be noted that pre-processing of the histogram equalization may minimize the grey level difference between the reference die images and the target die images, as shown in FIG. 4. Accordingly, the sensitivity of the defect detection shall be increased.

In addition to the histogram equalization, for calculating differences of pixel values of corresponding pixels of the target die images and the reference die images of a same location, an image alignment has to be performed on each pair of the target die images and the reference die images. In some embodiments, each of the target die images is aligned with the corresponding reference die image captured at the same location of a die. For example, the target die image T(i, j) is aligned with the reference die image R(i, j), the target die image T(i+1, j+1) is aligned with the reference die image R(i+1, j+1), the target die image T(i+2, j+2) is aligned with the reference die image R(i+2, j+2), and so on. In some embodiments, the image alignment of each pair of the target die images and the reference die images is a sub-pixel alignment performed by using a phase correlation.

One skilled in the art should have basic knowledge about the phase correlation, or could obtain relevant information about the phase correlation from related documents of image processing, therefore details of the phase correlation are not described herein. Moreover, the disclosure is not limited thereto. One skilled in the art can choose the algorithm for implementing the image alignment as their needs.

In some embodiments, multiple sets of the reference die images are obtained. Each set of the reference die images corresponds to a die of the reference wafer $W_{REF}$ but with a slight sub-pixel offset. For example, the wafer inspection tool 200 may scan the consecutive dies (e.g., $D_k$, $D_{k+1}$, $D_{k+2}$ as shown in FIG. 3) multiple times with a slight sub-pixel offset at each time. Directed to the scan images scanned at each time, the processor 130 may apply the rank filter thereto in order to obtain said multiple sets of the reference die images, where each set of the reference die images corresponds to the scan images scanned at one time. For example, for the first time the wafer inspection tool 200 scans the consecutive dies (e.g., $D_k$, $D_{k+1}$, $D_{k+2}$ as shown in FIG. 3), the processor 130 applies the rank filter to the output scan image to obtain a first set of the reference die images. For the second time the wafer inspection tool 200 scans the consecutive dies (e.g., $D_k$, $D_{k+1}$, $D_{k+2}$ as shown in FIG. 3), the processor 130 applies the rank filter to the output scan image to obtain a second set of the reference die images, and so on. As a result, each set of the reference die images has a slight sub-pixel offset. The processor 130 calculates alignment errors between the target die images and each set of the reference die images, and selects a set of the reference die images which results in the smallest alignment error for later use.

Figure 5:
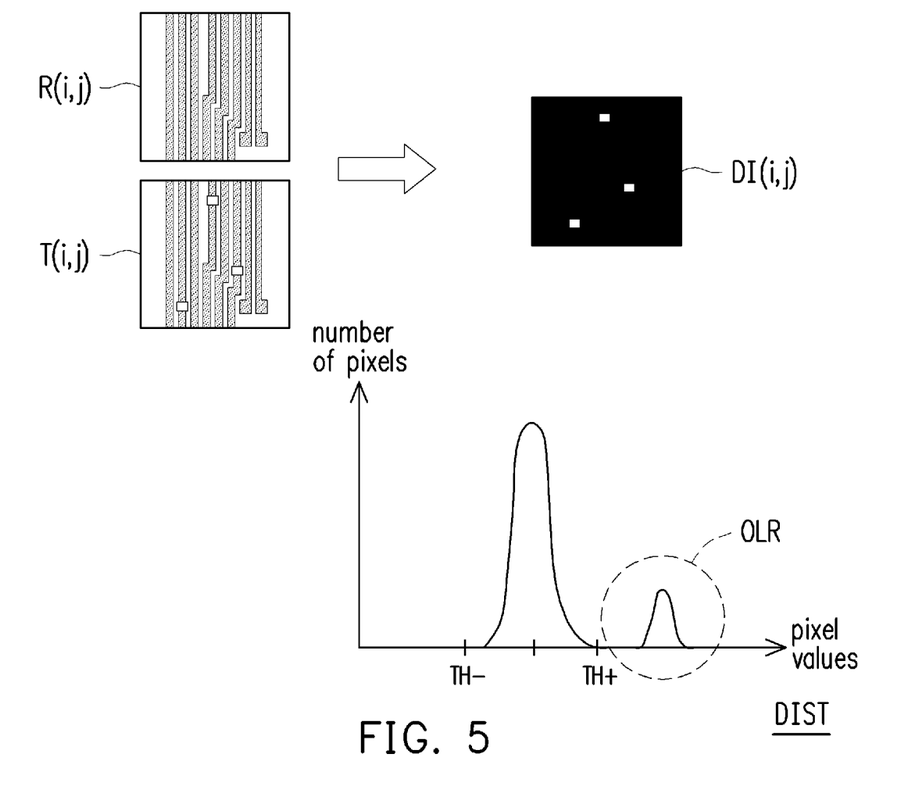
FIG. 5 illustrates a schematic diagram of detecting defects on a wafer according an embodiment of the disclosure.

FIG. 5 illustrates a schematic diagram of detecting defects on a wafer according an embodiment of the disclosure. In some embodiments, a set of the reference die images and the target die images are compared to detect all defects on the corresponding target die of the target wafer. It is noted that the comparison of the reference die images and the target die images for detecting the defects on the target die could be implement in various ways such as statistical test by setting at least one parameter. One exemplary embodiment is described below but it should be known that which is not limited in the embodiment.

In some embodiments, the processor 130 calculates a difference image of each pair of the target die images which have been pre-processed and the reference die images. The pixel value of each pixel in the difference image is a pixel value difference between the corresponding pixels of the target die image and the reference die image. Referring to FIG. 5, pixel values of the difference image DI(i, j) are pixel value differences of the target die image T(i, j) and the reference die image R(i, j). Most of the pixel values of the pixels of the difference image DI(i, j) should be around zero (depicted in black) except for the pixels corresponding to the defects (depicted in white). In the embodiment, the processor 130 further calculates a statistical distribution DIST of pixel values of the difference image DI(i, j) as depicted in FIG. 5, where the vertical axis of the diagram of the statistical distribution DIST represents the number of pixels, and the horizontal axis of the diagram of the statistical distribution DIST represents the pixel values. By setting at least one threshold $TH_-$ and $TH_+$ for determining the outliers OLR, the processor 130 may determine pixels corresponding to the outliers OLR of the statistical distribution DIST as the defects DF1, DF2, and DF3 which are occurred in the area of the target die at which the target die image T(i, j) is captured. By the aforementioned method, defects on the whole target die can be detected.

Figure 6:
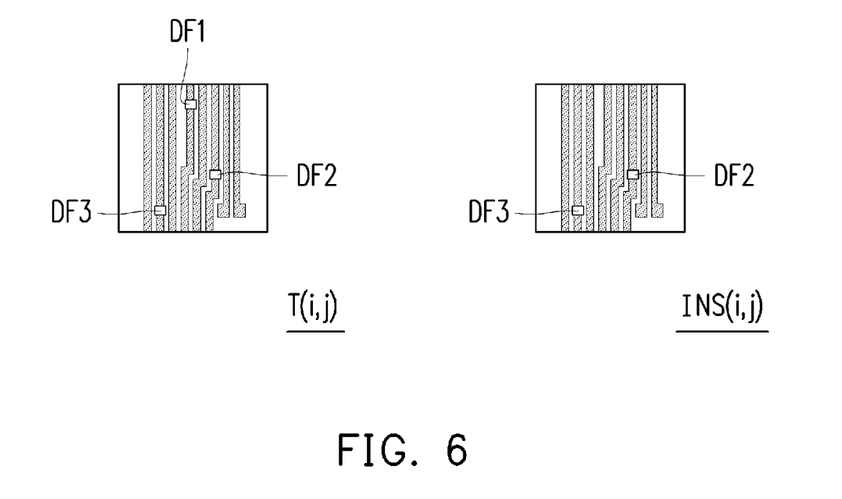
FIG. 6 illustrates a schematic diagram of detecting mask defect according to an embodiment of the disclosure.

FIG. 6 illustrates a schematic diagram of detecting mask defect according to an embodiment of the disclosure. The defects detected by comparing the target die images and the reference die images may include the mask defects resulting from the defect of the mask, and the random defects not resulting from the defect of the mask. The random defects are generated during the lithography process for various possible reasons, and detectable in the wafer inspections performed by the wafer inspection tool 200. Accordingly, the random defects obtained from the wafer inspection performed by the wafer inspection tool 200 are common to the defects detected by comparing the target die images and the reference die images, thus the common defects are deemed as defects which are not resulting from the mask.

In some embodiments, the processor 130 may receive information including the defects detected by the wafer inspection from the wafer inspection tool 200 through the connecting device 110, and excludes the defects detected by the wafer inspection from the defects detected by comparing the target die images and the reference die images. As a result, the defect left can be determined by the processor 130 as the defect resulting from the mask (i.e., the mask defect printed on the target wafer).

Referring to FIG. 6, the defects DF1, DF2, and DF3 are detected by comparing the target die image T(i, j) and the reference die image R(i, j). In the area on the die that the target die image T(i, j) is captured, the defect DF2 and DF3 are detected by the wafer inspection performed by the wafer inspection tool 200 as shown in the area INS(i, j) of FIG. 6. In this case, the defects DF2 and DF3 detected by the wafer inspection are common to the defects DF1, DF2, and DF3 which are detected by comparing the target die image T(i, j) and the reference die image R(i, j). Thus, the common defects DF2 and DF3 are excluded by the processor 130 from the defects DF1, DF2, and DF3 detected by comparing the target die image T(i, j) and the reference die image R(i, j), such that the mask defect DF1 can be determined and detected. By adopting the aforementioned method to each pair of the target die images and the reference die images, mask defects printed on the whole target die can be detected.

Accordingly, one can positioning at least one defect on the mask according to the at least one mask defect printed on the target wafer and detected according to the scan images of the wafer inspection tool 200.

Figure 7:
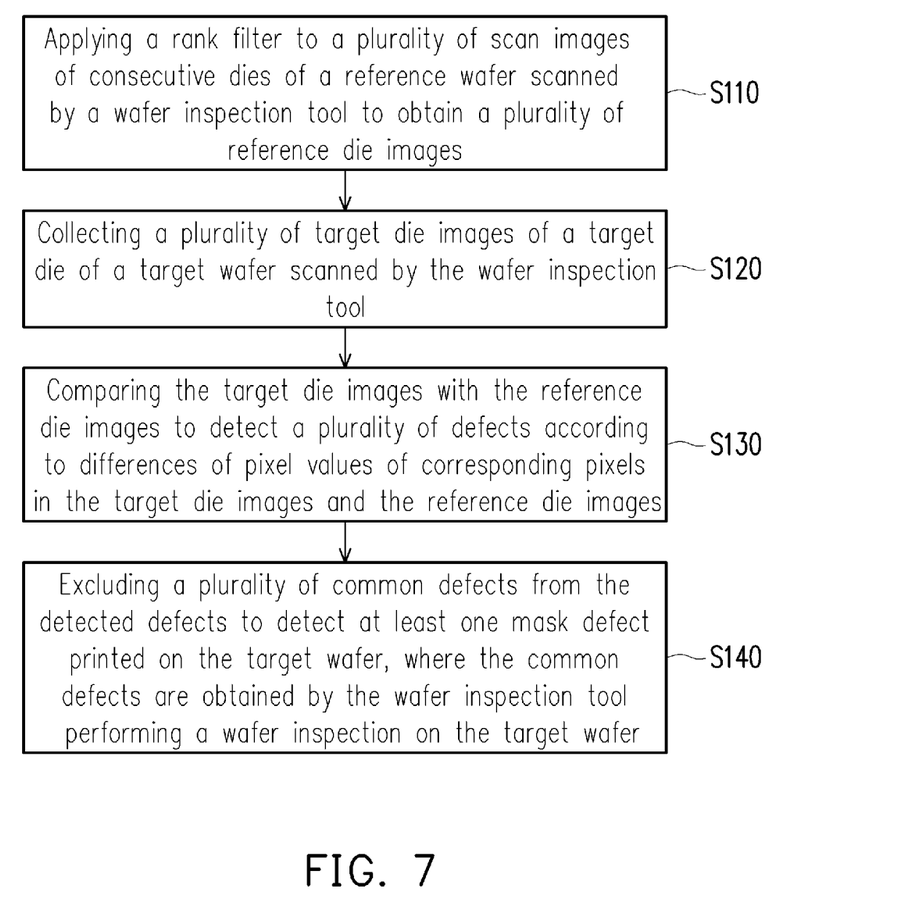
FIG. 7 illustrates a flowchart of a defect detecting system according to an embodiment of the disclosure.

FIG. 7 illustrates a flowchart of a defect detecting method according to an embodiment of the disclosure. The defect detecting method may be implemented by the aforementioned defect defecting system 100. Details of each steps are described in the foregoing descriptions, which are not repeated herein.

Referring to FIG. 7, in step S110, a rank filter is applied to a plurality of scan images of consecutive dies of a reference wafer scanned by a wafer inspection tool to obtain a plurality of reference die images. In step S120, a plurality of target die images of a target die of a target wafer scanned by the wafer inspection tool is collected. In step S130, the target die images are compared with the reference die images to detect a plurality of defects according to differences of pixel values of corresponding pixels in the target die images and the reference die images. In step 140, a plurality of common defects are excluded from the detected defects to detect at least one mask defect printed on the target wafer.

A non-transitory computer-readable medium is also introduced in an embodiment of the disclosure as below. The non-transitory computer-readable medium includes processor executable instructions. When the instructions are executed by a processor, the defect detecting method as described before can be implemented.

By adopting the defect detecting method, early detection of mask defects potentially on the first wafer that the mask defects are printed can be achieved. In addition, the disclosed defect detecting method can be an off-tool detection which does not need to run in real time. Therefore, more advanced algorithms such as algorithms for image processing or image comparison can be applied, and the flexibility and the accuracy can be improved.

Furthermore, all defects on mask may be detected by ordinary mask inspections, but the detected defects on the mask may not cause defects on the wafer. By adopting the disclosed defect detecting method which is based on defects substantially printed on the wafer, overreactions (e.g., repair or replace the mask when it is not needed to) to the detection result of the ordinary mask inspections can be avoided. Accordingly, the material costs can be reduced.

According to some embodiments, a defect detecting method includes applying a rank filter to a plurality of scan images of consecutive dies of a reference wafer scanned by a wafer inspection tool to obtain a plurality of reference die images, collecting a plurality of target die images of a target die of a target wafer scanned by the wafer inspection tool, comparing the target die images with the reference die images to detect a plurality of defects according to differences of pixel values of corresponding pixels in the target die images and the reference die images, and excluding a plurality of common defects from the detected defects to detect at least one mask defect printed on the target wafer. In which, the common defects are obtained by the wafer inspection tool performing a wafer inspection on the target wafer.

According to some embodiments, a defect detecting system includes a connecting device configured to connect a wafer inspection tool to receive scan images scanned by the wafer inspection tool, a storage medium configured to store the scan images received by the connecting device, and a processor coupled to the connecting device and the storage medium. The processor is configured to execute instructions to perform steps of applying a rank filter to the scan images of consecutive dies of a reference wafer scanned by the wafer inspection tool to obtain a plurality of reference die images, collecting a plurality of target die images of a target die of a target wafer scanned by the wafer inspection tool, comparing the target die images with the reference die images to detect a plurality of defects according to differences of pixel values of corresponding pixels in the target die images and the reference die images, and excluding a plurality of common defects from the detected defects to detect at least one mask defect printed on the target wafer. In which, the common defects are obtained by the wafer inspection tool performing a wafer inspection on the target wafer.

According to some embodiments, a defect detecting method includes collecting a plurality of target die images of a target die of a target die wafer scanned by performing a wafer inspection on the target wafer to obtain a plurality of first defects by using a wafer inspection tool, comparing a plurality of target die images of a target die of a target die wafer scanned by the wafer inspection tool with a set of reference die images to obtain a plurality of second defects, and detecting at least one mask defect printed on the target wafer by excluding the plurality of first defects from the plurality of second defects.

According to some embodiments, a non-transitory computer-readable medium includes processor executable instructions that when executed perform a method for detecting defects. The method includes applying a rank filter to a plurality of scan images of consecutive dies of a reference wafer scanned by a wafer inspection tool to obtain a plurality of reference die images, collecting a plurality of target die images of a target die of a target wafer scanned by the wafer inspection tool, comparing the target die images with the reference die images to detect a plurality of defects according to differences of pixel values of corresponding pixels in the target die images and the reference die images, and excluding a plurality of common defects from the detected defects to detect at least one mask defect printed on the target wafer. In which, the common defects are obtained by the wafer inspection tool performing a wafer inspection on the target wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A defect detecting method, comprising:
applying a rank filter to a plurality of scan images of consecutive dies of a reference wafer scanned by a wafer inspection tool to obtain a plurality of reference die images, wherein the reference wafer is printed by a mask with all defects repaired;
collecting a plurality of target die images of a target die of a target wafer scanned by the wafer inspection tool;
comparing the target die images with the reference die images to detect a plurality of defects according to differences of pixel values of corresponding pixels in the target die images and the reference die images; and
excluding a plurality of common defects from the detected defects to detect at least one mask defect printed on the target wafer, wherein the common defects are random defects obtained by the wafer inspection tool performing a wafer inspection on the target wafer in a die-to-die comparison manner and common to the defected defects.

2. The defect detecting method according to claim 1, wherein the scan images of the consecutive dies in each scan of the inspection tool are stacked into a three-dimensional (3D) array of pixels and the rank filter is applied to the pixels of each stack to obtain a reference pixel value, wherein the reference pixel values of the stacks of the 3D array of pixels form one of the reference die images.

3. The defect detecting method according to claim 1, wherein comparing the target die images with the reference die images comprises:
performing a histogram equalization on the target die images to match a histogram of the target die images with a histogram of the reference die images.

4. The defect detecting method according to claim 3, wherein comparing the target die images with the reference die images comprises:
performing an image alignment to the target die images and the reference die images to align the target die images and the reference die images.

5. The defect detecting method according to claim 4, wherein the wafer inspection tool is configured to scan the consecutive dies to obtain the scan images for a plurality of times, wherein applying the rank filter to the scan images comprises:
applying the rank filter to the scan images obtained at each time in order to obtain a plurality sets of the reference die images, wherein at each time, the wafer inspection tool scans the consecutive dies with a sub-pixel offset and each set of the reference die images corresponds to the scan images scanned at one of the plurality of times, and
wherein performing the image alignment to the target die images and the reference die images to align the target die images and the reference die images comprises:
calculating an alignment error according to the target die images and each set of the reference die images; and selecting the set of the reference die images corresponding to the smallest alignment error for detecting the defects.

6. The defect detecting method according to claim 4, wherein the image alignment is a sub-pixel alignment performed by using phase correlation.

7. The defect detecting method according to claim 1, wherein comparing the target die images with the reference die images to detect the defects according to differences of pixel values of corresponding pixels in the target die images and the reference die images comprises:
calculating a difference image of a pair of the target die images and the reference die images;
calculating a statistical distribution of pixel values of the difference image; and
determining pixels corresponding to outliers in the statistical distribution as the defects.

8. The defect detecting method according to claim 1, wherein a number of the consecutive dies is larger than or equal to 3.

9. The defect detecting method according to claim 1, wherein the scan images of the consecutive dies of the reference wafer and the target die images of the target die of the target wafer are scanned by the wafer inspection tool under a same imaging condition.

10. A defect detecting system, comprising:
a connecting device, configured to connect a wafer inspection tool to receive scan images scanned by the wafer inspection tool;
a storage medium, configured to store the scan images received by the connecting device;
a processor, coupled to the connecting device and the storage medium, and configured to execute instructions to perform steps of:
applying a rank filter to the scan images of consecutive dies of a reference wafer scanned by the wafer inspection tool to obtain a plurality of reference die images, wherein the reference wafer is printed by a mask with all defects repaired;
collecting a plurality of target die images of a target die of a target wafer scanned by the wafer inspection tool;
comparing the target die images with the reference die images to detect a plurality of defects according to differences of pixel values of corresponding pixels in the target die images and the reference die images; and
excluding a plurality of common defects from the detected defects to detect at least one mask defect printed on the target wafer, wherein the common defects are random defects obtained by the wafer inspection tool performing a wafer inspection on the target wafer in a die-to-die comparison manner and common to the defected defects.

11. The defect detecting system according to claim 10, wherein a number of the consecutive dies is larger than or equal to 3.

12. The defect detecting system according to claim 10, wherein the defect detecting system is disposed or embedded in the wafer inspection tool.

13. The defect detecting system according to claim 10, wherein the defect detecting system is externally connected to the wafer inspection tool.

14. A defect detecting method applicable to a defect detecting system, comprising:
performing a wafer inspection on the target wafer in a die-to-die comparison manner to obtain a plurality of first defects by using a wafer inspection tool;
comparing a plurality of target die images of a target die of a target die wafer scanned by the wafer inspection tool with a set of reference die images to obtain a plurality of second defects, wherein the reference die images are defect-free die images; and
detecting at least one mask defect printed on the target wafer by excluding the plurality of first defects that are random defects common to the second defects from the plurality of second defects.

15. The defect detecting method according to claim 14, wherein each set of the defect-free die images are obtained by applying a rank filter to a plurality of scan images of consecutive dies of a reference wafer scanned by the wafer inspection tool.

16. The defect detecting method according to claim 15, wherein the reference wafer is a mask-defect-free wafer.

17. The defect detecting method according to claim 15, wherein the wafer inspection tool is configured to scan the consecutive dies to obtain the scan images for a plurality of times, the defect detecting method further comprising:
applying the rank filter to the scan images obtained at each time in order to obtain a plurality sets of the reference die images, wherein at each time, the wafer inspection tool scans the consecutive dies with a sub-pixel offset and each set of the reference die images corresponds to the scan images scanned at one of the plurality of times;
calculating an alignment error according to the target die images and each set of the reference die images; and
selecting the set of the reference die images corresponding to the smallest alignment error for obtaining the second defects.

18. The defect detecting method according to claim 14, wherein comparing the target die images with the set of reference die images to obtain the plurality of second defects comprises:
performing at least one image processing on the target die images and the set of reference die images, wherein the at least one image processing comprises histogram equalization or image alignment; and
comparing the processed target die images and the set of reference die images to obtain the plurality of second defects.

19. The defect detecting method according to claim 15, wherein the scan images of the consecutive dies of the reference wafer and the target die images of the target die of the target wafer are scanned by the wafer inspection tool under a same imaging condition.

20. The defect detecting method according to claim 14, wherein comparing the plurality of target die images with the reference die images to obtain a plurality of second defects comprises:
calculating a difference image of a pair of the target die images and the reference die images;
calculating a statistical distribution of pixel values of the difference image; and
determining pixels corresponding to outliers in the statistical distribution as the second defects.

* * * * *